(12) United States Patent
Quack et al.

(10) Patent No.: US 8,159,298 B2
(45) Date of Patent: *Apr. 17, 2012

(54) LINEARIZATION CIRCUITS AND METHODS FOR POWER AMPLIFICATION

(75) Inventors: Sylvain Quack, Issy-les-Moulineaux (FR); Angelo Malvasi, Broni (IT)

(73) Assignee: ACCO Semiconductor, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/088,684

(22) Filed: Apr. 18, 2011

(65) Prior Publication Data

US 2011/0193636 A1 Aug. 11, 2011

Related U.S. Application Data

(62) Division of application No. 12/549,737, filed on Aug. 28, 2009, now Pat. No. 7,952,431.

(51) Int. Cl.
*H03F 1/26* (2006.01)
(52) U.S. Cl. .................. 330/149; 330/311; 330/296
(58) Field of Classification Search .............. 330/149, 330/311, 136; 455/114.3; 375/296–297
See application file for complete search history.

(56) References Cited

U.S. PATENT DOCUMENTS

| | | | |
|---|---|---|---|
| 4,255,714 A | 3/1981 | Rosen | |
| 4,353,036 A | 10/1982 | Hoover | |
| 4,523,111 A | 6/1985 | Baliga | |
| 4,811,075 A | 3/1989 | Eklund | |
| 5,061,903 A | 10/1991 | Vasile | |
| 5,126,807 A | 6/1992 | Baba et al. | |
| 5,559,049 A | 9/1996 | Cho | |
| 5,677,927 A | 10/1997 | Fullerton et al. | |
| 5,898,198 A | 4/1999 | Herbert et al. | |
| 5,912,490 A | 6/1999 | Hebert et al. | |
| 5,969,582 A | 10/1999 | Boesch et al. | |
| 6,061,008 A | 5/2000 | Abbey | |
| 6,061,555 A | 5/2000 | Bultman et al. | |
| 6,081,159 A | 6/2000 | Kim et al. | |
| 6,088,484 A | 7/2000 | Mead | |

(Continued)

FOREIGN PATENT DOCUMENTS

EP 2006009009 1/1996

(Continued)

OTHER PUBLICATIONS

Gautier, D., et al., "Improved Delta Sigma Modulators for High Speed Applications," Acco Semiconductors, Mar. 25, 2009.

(Continued)

*Primary Examiner* — Hieu Nguyen
(74) *Attorney, Agent, or Firm* — Peters Verny, LLP

(57) ABSTRACT

Linearization circuits of the invention are used in conjunction with power amplification circuits that comprise a power amplifier core. Exemplary linearization circuits comprise a replica of the power amplifier core. In operation, the linearization produces an envelope signal from an RF signal. The envelope signal is used to control the replica to produce an analog output signal which represents the inverse of the AM to AM distortion of the power amplifier core. The linearization circuit then biases the RF signal with the inverted nonlinear signal of the replica to control the power amplifier core. The power amplifier core and the replica thereof can be defined on the same semiconductor die so both respond to process variables similarly.

6 Claims, 5 Drawing Sheets

U.S. PATENT DOCUMENTS

| | | | |
|---|---|---|---|
| 6,242,978 B1 * | 6/2001 | Danielsons | 330/149 |
| 6,275,177 B1 | 8/2001 | Ho et al. | |
| 6,300,835 B1 | 10/2001 | Seely et al. | |
| 6,304,608 B1 | 10/2001 | Chen et al. | |
| 6,384,688 B1 | 5/2002 | Fujioka et al. | |
| 6,414,545 B1 | 7/2002 | Zhang | |
| 6,570,518 B2 | 5/2003 | Riley et al. | |
| 6,600,369 B2 * | 7/2003 | Mitzlaff | 330/149 |
| 6,633,195 B2 | 10/2003 | Baudelot et al. | |
| 6,703,684 B2 | 3/2004 | Udrea et al. | |
| 6,784,470 B2 | 8/2004 | Davis | |
| 6,967,608 B1 | 11/2005 | Maloberti et al. | |
| 7,049,669 B2 | 5/2006 | Ma et al. | |
| 7,162,042 B2 | 1/2007 | Spencer et al. | |
| 7,259,621 B2 | 8/2007 | Kusunoki et al. | |
| 7,312,481 B2 | 12/2007 | Chen et al. | |
| 7,348,826 B1 | 3/2008 | Klein et al. | |
| 7,378,912 B2 * | 5/2008 | Tanahashi et al. | 330/311 |
| 7,522,079 B1 | 4/2009 | Wu | |
| 7,554,397 B2 | 6/2009 | Vitzilaios et al. | |
| 7,656,229 B2 | 2/2010 | Deng et al. | |
| 7,679,448 B1 | 3/2010 | McAdam et al. | |
| 7,808,415 B1 | 10/2010 | Robbe et al. | |
| 7,863,645 B2 | 1/2011 | Masliah et al. | |
| 7,952,431 B2 | 5/2011 | Quack et al. | |
| 7,969,243 B2 | 6/2011 | Bracale et al. | |
| 7,969,341 B2 | 6/2011 | Robbe et al. | |
| 8,008,731 B2 | 8/2011 | Masliah | |
| 2002/0093442 A1 | 7/2002 | Gupta | |
| 2002/0094795 A1 | 7/2002 | Mitzlaff | |
| 2005/0287966 A1 | 12/2005 | Yoshimi et al. | |
| 2006/0228850 A1 | 10/2006 | Tsai et al. | |
| 2007/0018865 A1 | 1/2007 | Chang et al. | |
| 2007/0178856 A1 | 8/2007 | Mitzlaff et al. | |
| 2007/0182485 A1 | 8/2007 | Ko | |
| 2008/0031382 A1 | 2/2008 | Aoki | |
| 2008/0079499 A1 | 4/2008 | Tsai | |
| 2008/0291069 A1 | 11/2008 | Inukai et al. | |
| 2008/0297386 A1 | 12/2008 | Maloberti et al. | |
| 2009/0066549 A1 | 3/2009 | Thomsen et al. | |
| 2010/0026393 A1 | 2/2010 | Keerti et al. | |

FOREIGN PATENT DOCUMENTS

| | | |
|---|---|---|
| GB | 2336485 A | 10/1999 |
| IL | 125022 | 9/2001 |
| WO | 9956311 | 11/1999 |
| WO | 0139451 | 5/2001 |
| WO | 2006054148 | 5/2006 |
| WO | 2007042850 | 4/2007 |

OTHER PUBLICATIONS

Azakkour, A. et al., "Challenges for a new integrated Ultra-wideband (UWB) source," IEEE, 2003 pp. 433-437.

Azakkour, A. et al., "A new integrated moncycle generator and transmitter for Ultra-wideband (UWB) communications," IEEE Radio Frequency Circuits Symposium, 2005 pp. 79-82.

Choi, Y. H. et al., "Gated UWB Pulse Signal Generation," IEEE, 2004 pp. 122-124.

PCT/US2008/001938 Int'l Search Report and Written Opinion, Jun. 26, 2008.

PCT/IB05/003426 Int'l Search Report, Mar. 20, 2006.

PCT/IB05/003426 Written Opinion, May 16, 2007.

PCT/IB05/003029 Int'l Search Report, Jul. 6, 2006.

PCT/IB05/003029 Written Opinion, Mar. 12, 2008.

PCT/US10/27921 Int'l Search Report and Written Opinion, May 10, 2010.

PCT/US10/30770 Int'l Search Report and Written Opinion, Jun. 16, 2010.

PCT/US10/041985 Int'l Search Report and Written Opinion, Sep. 9, 2010.

PCT/US11/32488 Int'l Search Report and Written Opinion, Jun. 28, 2011.

Vaes, H. M. J. et al., "High Voltage, High Current Lateral Devices," IEDM Technical Digest, 1988, pp. 87-90.

Pocha, Michael D. et al. "Threshold Voltage Controllability in Double-Diffused MOS Transistors," IEEE Transactions on Electronic Devices, vol. ED-21, No. 12, Dec. 1994.

Taiwanese Application 099124967, Office Action of the IPO, English translation, Aug. 24, 2011.

Taiwanese Application 099124967, Taiwanese Search Report, Aug. 24, 2011.

* cited by examiner

LINEARIZATION CIRCUITS AND METHODS FOR POWER AMPLIFICATION

CROSS-REFERENCE TO RELATED APPLICATIONS

This application is a Divisional of U.S. patent application Ser. No. 12/549,737 filed on Aug. 28, 2009 and entitled "Linearization Circuits and Methods for Power Amplification," now U.S. Pat. No. 7,952,431 issued on May 31, 2011,which is Incorporated herein by reference.

BACKGROUND

1. Field of Invention

The present invention relates generally to semiconductor devices and more particularly to semiconductor devices configured for power application.

2. Related Art

Metal-oxide semiconductor (MOS) devices designed for radio-frequency (RF) power application operate in a non-linear range and therefore distort the input single. The general approach for correcting such distortion has been to employ a feedback loop that includes the output signal. These methods can suffer from loop stabilities issues, however. Accordingly, better linearization of RF power amplification is desired.

SUMMARY

An exemplary amplifier circuit of the present invention comprises a power amplification circuit and a linearization circuit. In various embodiments the power amplification and linearization circuits are both disposed on a die. The power amplification circuit comprises a power amplifier core including an amplifier transistor having a gate coupled to a signal source input. The linearization circuit is coupled between the signal source input and the gate of the amplifier transistor and includes a replica of the power amplifier core. In some embodiments, the active components of the replica are smaller than the corresponding active components of the power amplifier core. The linearization circuit is configured to add a nonlinear analog signal at the gate of the first amplifier transistor. In some embodiments the linearization circuit does not include a clock and/or does not include an analog to digital converter.

In various embodiments the power amplifier core comprises a cascode circuit that includes the first amplifier transistor. In some of these embodiments the first amplifier transistor comprises a MOS transistor and the cascode circuit further includes a second amplifier transistor having a drain coupled to a source of the first amplifier transistor. In other embodiments, instead of a second amplifier transistor, the cascode circuit further includes a JFET having a drain coupled to a source of the first amplifier transistor.

In various embodiments of the exemplary amplifier circuit the linearization circuit further includes an envelope detector coupled between the signal source input and the replica of the power amplifier core, where the envelope detector is configured to produce an envelope signal. In some of these embodiments the linearization circuit further includes a first operational amplifier coupled between the envelope detector and the replica, and a second operational amplifier coupled between the replica and the gate of the amplifier transistor. The first operational amplifier amplifies the envelope signal before it is applied to the replica, while the second operational amplifier amplifies the inverted non-linear signal from the replica before it is applied to the amplifier core.

In further embodiments the replica of the amplifier core includes a replica of the amplifier transistor. In these embodiments, the envelope signal is applied to a gate of the replica of the amplifier transistor. In some of these embodiments a DC bias source and a drain of the replica of the amplifier transistor are both coupled to the gate of the amplifier transistor.

The present invention also provides devices that include amplifier circuits. An exemplary device comprises a package and an integrated passive device and a die both attached to the package, either both on the same side of the package or each disposed on an opposite side thereof. The integrated passive device includes an input matching block and an output matching block. The die includes a power amplifier core coupled between the input and output matching blocks and including an amplifier transistor having a gate. The die also includes a replica of the power amplifier core, where an output of the replica is coupled to the gate of the amplifier transistor. The replica of the power amplifier core, in some embodiments, includes a replica of the amplifier transistor and in these embodiments the die further comprises an envelope detector coupled to a gate of the replica of the amplifier transistor. In various embodiments the package is coupled to either or both of an RF signal source and an antenna.

The present invention also provides methods for amplifying an RF signal. An exemplary method comprises producing an envelope signal from the RF signal, producing an inverted non-linear signal from the envelope signal, and producing a linearly amplified RF signal. The amplified RF signal is produced by applying a biased RF signal to a transistor of a power amplifier core, where the biased RF signal comprises the RF signal plus the inverted non-linear signal. In this method any or all of the steps of the method are performed on a common die. In various embodiments a clock signal is not employed and/or analog to digital conversion is not performed. Also in various embodiments a delay between the RF signal and the inverted non-linear signal in the biased RF signal is between about 10 ns and 15 ns.

DETAILED DESCRIPTION

The present disclosure is directed to linearization circuits for use in power amplification and to methods for linearly amplifying RF signals. Linearization circuits of the present invention are configured to be used in conjunction with power amplification circuits that comprise a power amplifier core. Such linearization circuits comprise a replica of the power amplifier core where the replica is a scaled copy of the power amplifier core preferably fabricated in the same substrate as, and in close proximity to, the power amplifier core. In operation, both the power amplification and linearization circuits receive an RF signal, and the linearization circuit produces an envelope signal from the RF signal. The envelope signal is used to control the replica of the power amplifier core to produce an analog output signal which represents the inverse of the AM to AM distortion of the power amplifier core. The linearization circuit biases the RF signal with the inverted non-linear signal of the replica to control the power amplifier core. Accordingly, the linearization circuits of the present invention applies an analog AM to AM pre-distortion to the power amplifier core to compensate for the non-linear response of the power amplifier core, resulting in a more linear amplification of the RF signal.

Advantages of the present invention include low current consumption and no need for the linearization circuit 115 to include a clock, an analog-to-digital converter (ADC), nor any other digital block. Rather, the linearization circuit can be entirely analog in various embodiments. Additionally, process variations in the fabrication of the power amplifier core that affect the linearity of the power amplifier core response will similarly affect the linearity of the response of the replica. It will be appreciated, therefore, that the overall combination of the power amplification and linearization circuits becomes insensitive to such process variations. It will be further appreciated that linearization is achieved in the present invention without resort to a feedback from the output signal of the power amplifier core.

Figure 1:
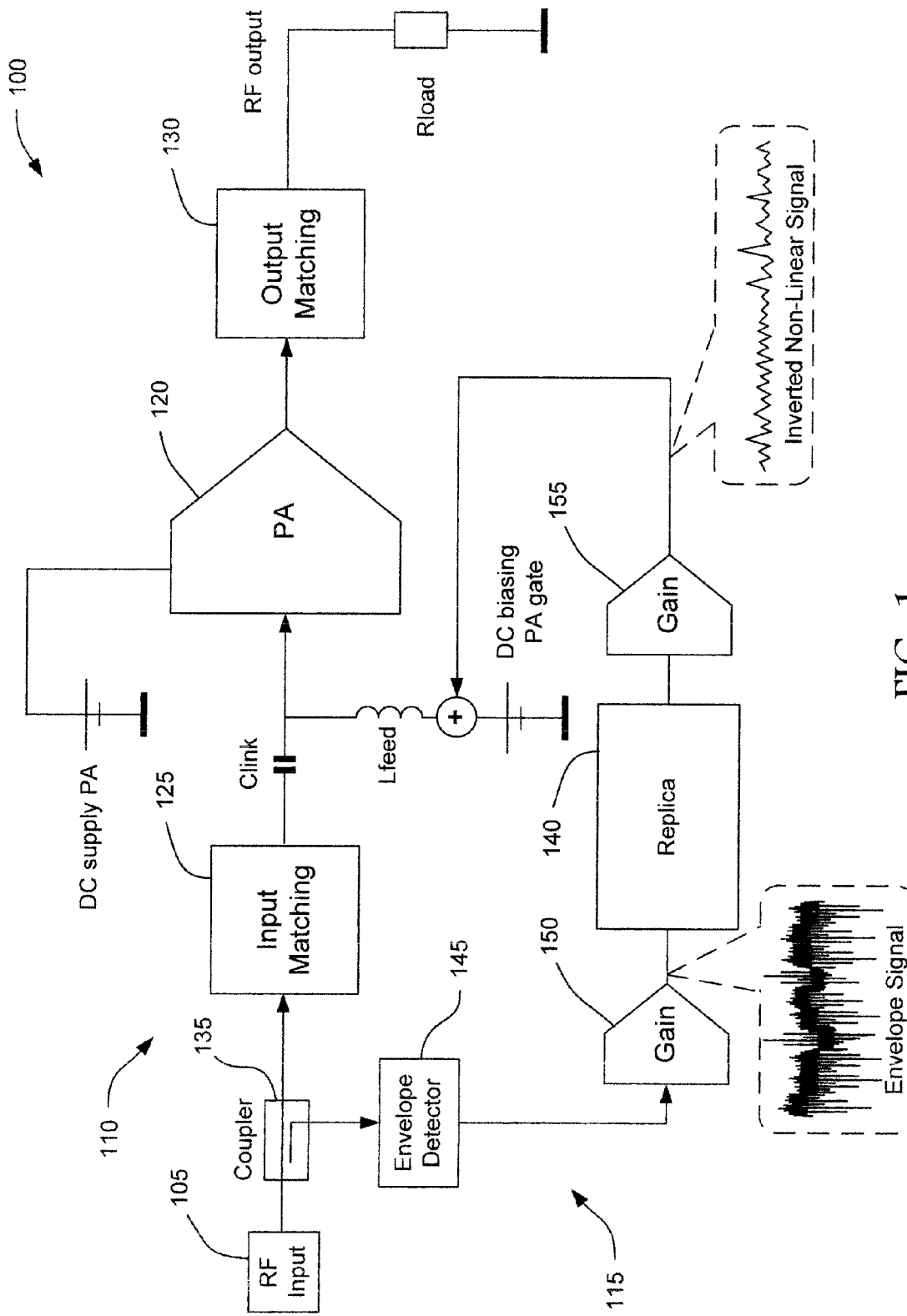
FIG. 1 is a schematic representation of an exemplary amplifier circuit according to an embodiment of the present invention.

FIG. 1 is a schematic representation of an amplifier circuit 100 configured to receive an RF signal from a signal source input 105 and produce a linearly amplified output signal. The amplifier circuit 100 comprises a power amplification circuit 110 and a linearization circuit 115. The power amplification circuit 110 comprises a power amplifier core 120, an input matching block 125, and an output matching block 130. Exemplary power amplifier cores 120 are described below with reference to FIGS. 2 and 3.

Both the power amplification circuit 110 and the linearization circuit 115 are coupled to a signal source input 105 to receive the same RF signal. The power amplification circuit 110 and the linearization circuit 115 can be coupled to the signal source input 105, for example, with a coupler 135. Exemplary signal source inputs 105 include wire bond pads and die attach pads.

The linearization circuit 115 is coupled between the signal source input 105 and the power amplifier core 120 and comprises a replica 140 of the power amplifier core 120. A replica 120 includes a scaled copy of the active components of the power amplifier core 120. The replica 140 is fabricated in the same substrate as the power amplifier core 120, in some embodiments. In some of these embodiments the replica 140 is also fabricated in close proximity to the power amplifier core 120. An exemplary substrate comprises a CMOS die. Placing the replica 140 close to the power amplifier core 120 enables both good transistor matching and a good fit of the non-linear inverted response from the replica 140 to the non-linear response from power amplifier core 120. The scale of the replica 140 is smaller than the size of the power amplifier core 120 in some embodiments, though the scale is not necessarily limited to being smaller. In an exemplary replica 140, the active components are about $1/60^{th}$ the size of the corresponding components in the power amplifier core 120. In various embodiments, the scale of the active components of the replica 140 to the corresponding active components of the power amplifier core 120 is in a range from about $1/20^{th}$ to about $1/60^{th}$.

The linearization circuit 115 also comprises an envelope detector 145 coupled between the signal source input 105 and the replica 140. The envelope detector 145 produces an envelope signal from the RF signal. In some embodiments the envelope detector 145 is disposed on the same substrate as the power amplifier core 120. The envelope detector 145 is entirely analog in some instances. Suitable circuit designs for the envelope detector 145 are well known in the art.

The linearization circuit 115 can also comprise an amplifier 150, such as an operational amplifier, coupled between the envelope detector 145 and the replica 140 and configured to amplify the envelope signal. The linearization circuit 115 can further comprise an amplifier 155, which may also be an operational amplifier, coupled between the replica 140 and the power amplifier core 120 and configured to amplify the inverted non-linear signal from the replica 140. As shown in FIG. 1, the inverted non-linear signal output of the linearization circuit 115 is added to a DC bias voltage and is used to control the power amplifier core 120, as discussed in greater detail below.

In various embodiments, the power amplifier core 120 and the replica 140 are disposed on a die. In some of these embodiments any or all of the coupler 135, envelope detector 145, and amplifiers 150 and 155 are also disposed on the same die. The die can be attached to a package that also includes the other components of the power amplification and linearization circuits. For example, the input and output matching blocks 125 and 130 can be fabricated on an Integrated Passive Device (IPD) attached to the package. In some embodiments, the signal source input 105 comprises a wire bond pad or a die attach pad on the die or on the package. An example of a package including a die and an IPD is described in greater detail below with respect to FIG. 5.

Figure 2:
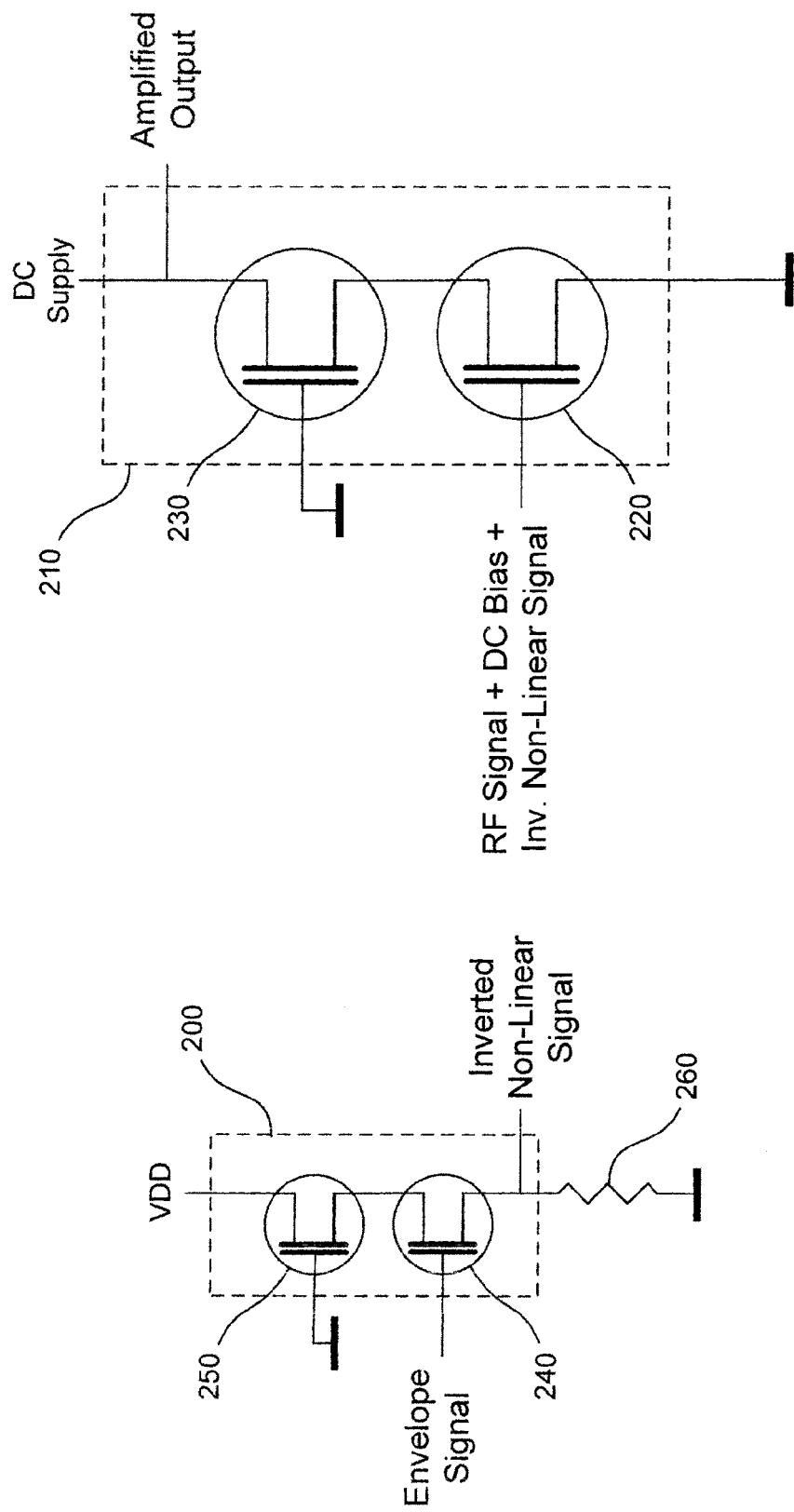
FIG. 2 is a schematic representation of an exemplary amplifier core and replica thereof according to an embodiment of the present invention.

FIG. 2 is a schematic representation of an exemplary replica 200 and corresponding power amplifier core 210. Power amplifier core 210 is one example of a power amplifier core 120 (FIG. 1). Power amplifier core 210 comprises two active components, a first amplifier transistor 220 and a second amplifier transistor 230 arranged in a cascode configuration, as illustrated. In some embodiments the first amplifier transistor 220 comprises a thin MOS while the second amplifier transistor 230 comprises a thick MOS. A source of the second amplifier transistor 230 is coupled to a DC supply and an output of the power amplifier core 210.

As used herein, "thick" and "thin" are comparative terms related to the channel lengths of the amplifier transistors 220, 230. For example, in one embodiment the second amplifier transistor 230 comprises a thick MOS having a channel length of 400 nm while the first amplifier transistor 220 comprises a thin MOS having a channel length of 180 nm. A thick MOS has a longer channel length than a thin MOS in the same power amplifier core 210, but are otherwise not limited by the exemplary values noted herein.

A gate of the first amplifier transistor 220 is controlled by the sum of the RF signal, a DC bias, and the inverted non-linear signal. In those embodiments in which the amplifier circuit 100 works in a current mode the DC bias and the inverted non-linear signal are added at a node where traces come together. In those embodiments in which the amplifier circuit 100 works in a voltage mode, the DC bias and the inverted non-linear signal can be added with a low frequency adder (see FIG. 1). The low frequency adder can comprise an operational amplifier, for example.

The replica 200 also comprises two amplifier transistors 240, 250, similarly arranged in a cascode configuration. The amplifier transistors 240, 250 are scaled copies of the amplifier transistors 220, 230, respectively. In those embodiments where the amplifier transistors 220, 230 comprise thin and thick MOS, the amplifier transistors 240, 250 also comprise thin and thick MOS, respectively. A gate of the amplifier transistor 240 is controlled by the envelope signal. A source of the amplifier transistor 250 is coupled to a power source, such as VDD, while a drain of the amplifier transistor 240 is coupled to an output of the replica 200. A resistor 260 is also coupled between the drain of the amplifier transistor 240 and ground. An appropriate resistance for the resistor 260 is given by the current to voltage transformation ratio.

Figure 3:
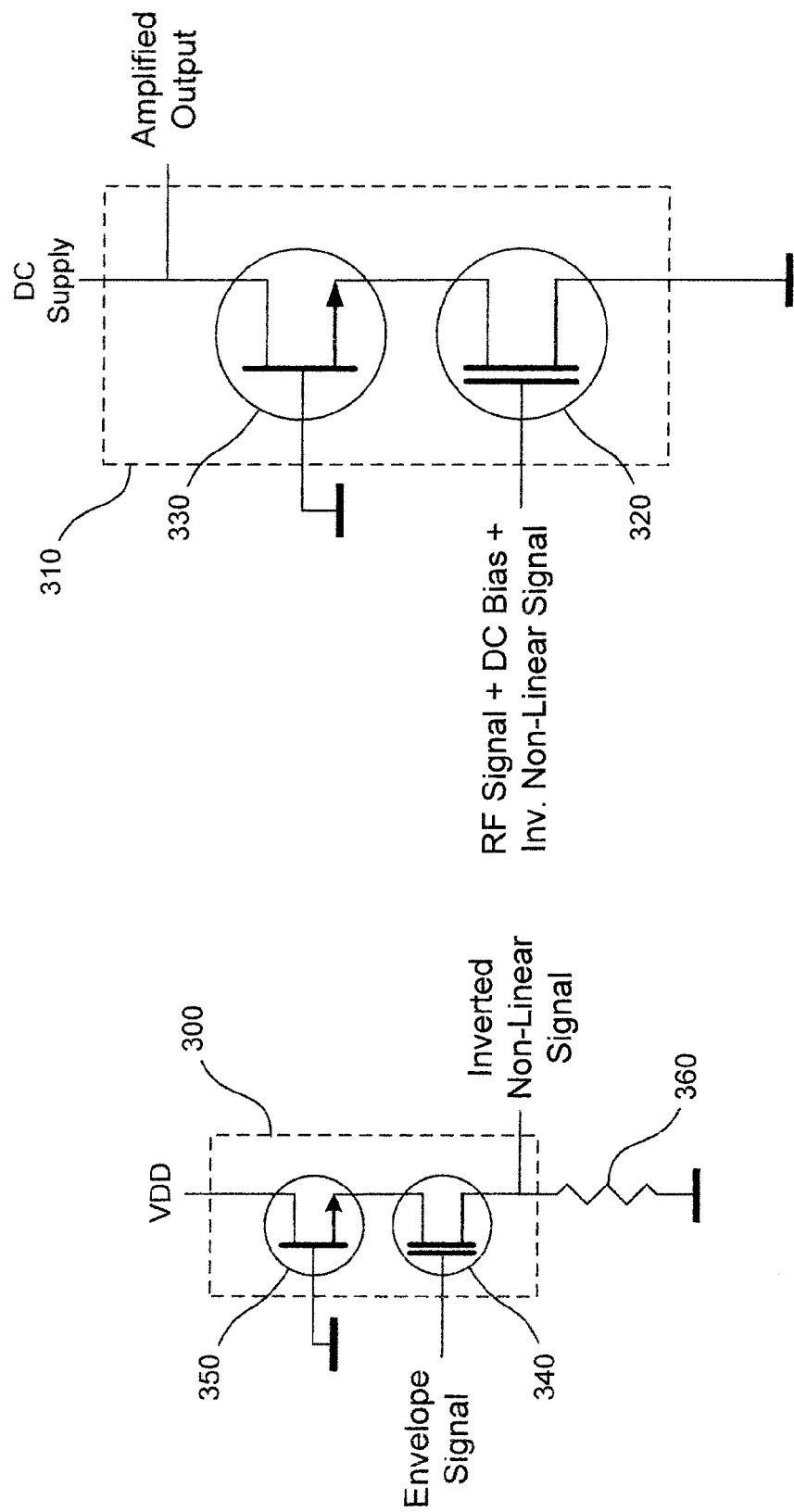
FIG. 3 is a schematic representation of an exemplary amplifier core and replica thereof according to another embodiment of the present invention.

FIG. 3 is a schematic representation of another exemplary replica 300 and corresponding power amplifier core 310. Power amplifier core 310 is another example of a power amplifier core 120 (FIG. 1). Power amplifier core 310 also comprises two active components, a first amplifier transistor 320 and a second amplifier transistor 330 arranged in a cascode configuration, as illustrated. In some embodiments the first amplifier transistor 320 comprises a thick MOS while the second amplifier transistor 330 comprises a JFET. A gate of the first amplifier transistor 320 is controlled by the sum of the RF signal, a DC bias, and the inverted non-linear signal. A source of the second amplifier transistor 330 is coupled to a DC supply and an output of the amplifier core 310.

The replica 300 also comprises two amplifier transistors 340, 350, arranged in a cascode configuration. The amplifier transistors 340, 350 are each scaled copies of the amplifier transistors 320, 330, respectively. In those embodiments where the amplifier transistors 320, 330 comprise a thick MOS and a JFET, the amplifier transistors 340, 350 also comprise a thick MOS and a JFET, respectively. A gate of the amplifier transistor 340 is controlled by the envelope signal. A source of the amplifier transistor 350 is coupled to a power source, such as VDD, while a drain of the amplifier transistor 340 is coupled to an output of the replica 300. A resistor 360 is also coupled between the drain of the amplifier transistor 340 and ground.

Figure 4:
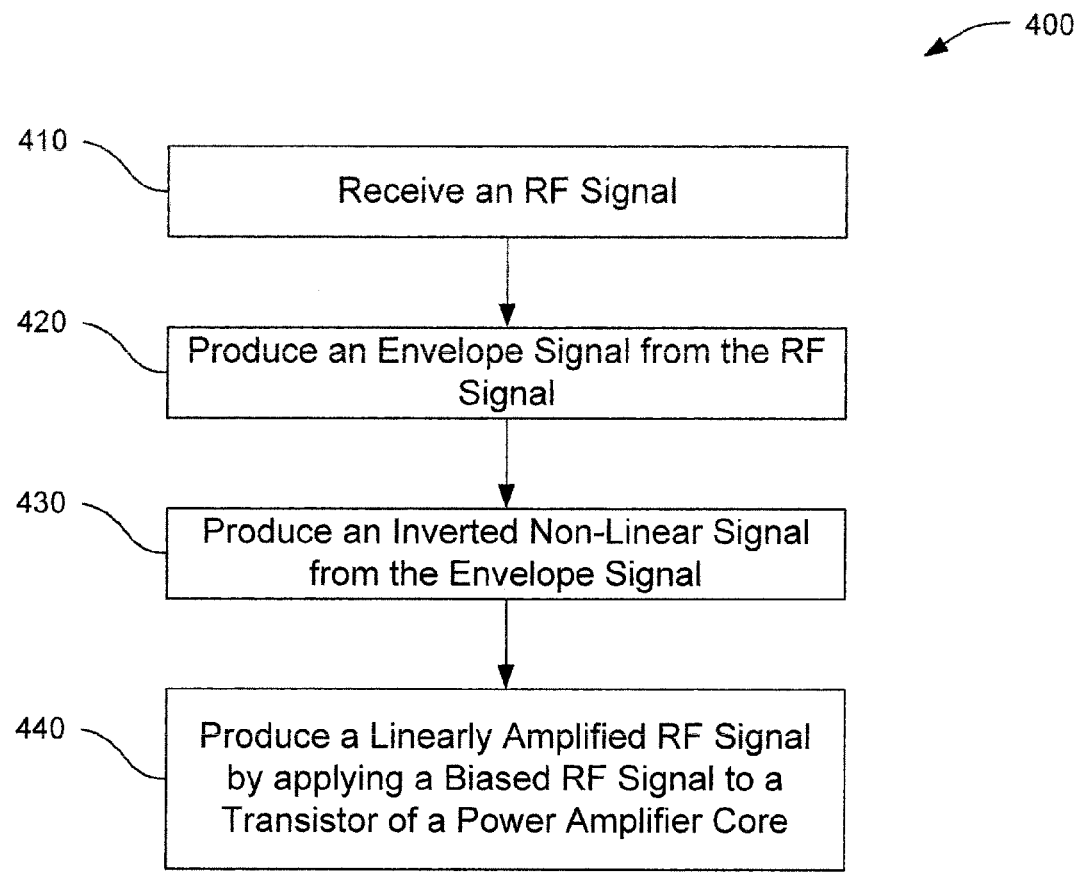
FIG. 4 is a flowchart representation of an exemplary method of RF signal amplification according to an embodiment of the present invention.

FIG. 4 is a flowchart representation of an exemplary amplification method 400 of the present invention. The method 400 comprises a step 410 of receiving an RF signal, a step 420 of producing an envelope signal from the RF signal, a step 430 of producing an inverted non-linear signal from the envelope signal, and a step 440 of producing a linearly amplified RF signal by applying a biased RF signal to a transistor of a power amplifier core, such as a MOS transistor. Here, the biased RF signal comprises the RF signal plus the inverted non-linear signal. In various embodiments any or all of the steps of method 400 may be performed by components formed on a common die, such as a CMOS die. For example, steps 440 and 430 can be performed by a power amplifier core and a corresponding replica fabricated on the same die. Other methods of the present invention can be carried out with one or more of the power amplifier core, replica, coupler, and envelope detector fabricated on separate dies.

Step 410 comprises receiving an RF signal and can include, for example, receiving the RF signal at a signal source input such as a wire bond pad or a die attach pad, either on the common die or on a package on which the die is attached. The RF signal can be received from an RF signal source (see FIG. 5) that is also coupled to the signal source input.

In step 420 an envelope signal is produced from the RF signal, for example, with an envelope detector 145. Producing the envelope signal can further comprise amplifying the envelope signal, for instance, with an operational amplifier.

In step 430 an inverted non-linear signal is produced from the envelope signal. In some embodiments the inverted non-linear signal is produced by controlling a replica of a power amplifier core with the envelope signal, and this can comprise controlling a gate of a transistor of the replica with the envelope signal. In some embodiments, the inverted non-linear signal can be obtained at a drain of that transistor. In some embodiments, that transistor is in a cascode arrangement, as shown in FIGS. 2 and 3, for example.

In step 440 a linearly amplified RF signal is produced, and in some embodiments on the same die as the inverted non-linear signal is produced in step 430. The same RF signal received in step 410 is also employed in step 440. The linearly amplified RF signal is produced by applying a biased RF signal to a transistor of the power amplifier core, and the biased RF signal comprises the RF signal plus the inverted non-linear signal. The biased RF signal additionally comprises a DC bias voltage, in some embodiments.

In some embodiments, producing the linearly amplified RF signal can further comprise amplifying the inverted non-linear signal, with an operational amplifier for example, before adding the inverted non-linear signal to the RF signal. Because the linearization circuit consumes some power, in some embodiments the method 400 selectively employs the linearization circuit when the linearization circuit will save more power than the circuit will consume. This can be achieved, in some embodiments, by switching off some or all of the components of the linearization circuit 115 when the power level is below a threshold. Power levels above the threshold can be thought of as belonging to a high power mode, while those below belong to a low power mode.

It is noted that several factors, such as filtering, can create a delay between the RF signal and the inverted non-linear signal when the two are added. The inverted non-linear signal will lag the RF signal and therefore the non-linearity of the power amplifier core 120 will not be corrected as completely as possible. In some embodiments the delay is tolerated, while in other embodiments the delay is corrected. For example, the RF signal can be delayed between the coupler 135 and the input matching block 125 by an amount equal to the delay introduced by the linearization circuit 115. It will be understood that in those embodiments in which delay is not corrected, the delay can be kept to a minimum of between about 10 ns and 15 ns, in some embodiments. The lack of a digital block, such as an ADC, helps to keep the delay small.

Figure 5:
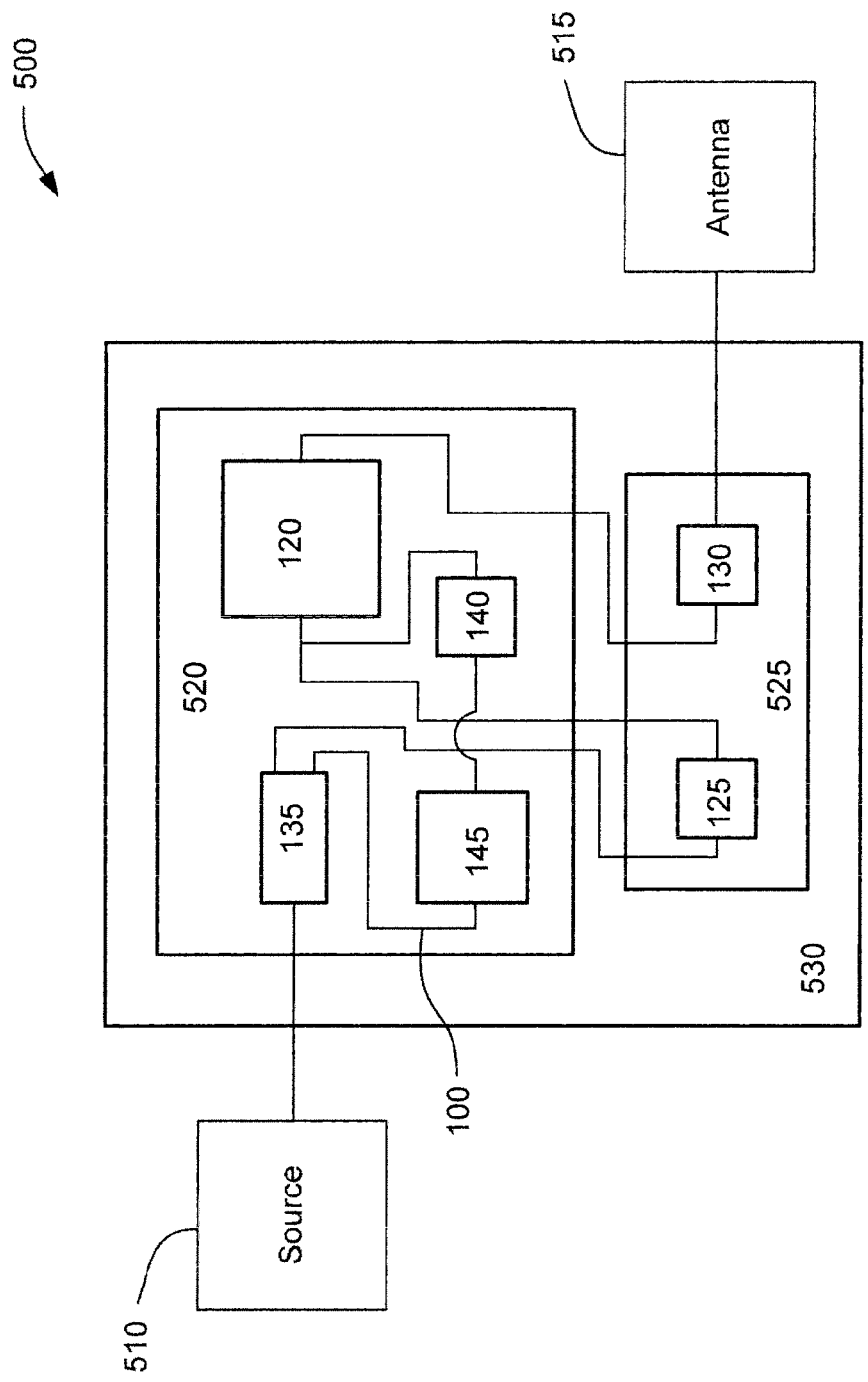
FIG. 5 is a schematic representation of an exemplary RF device according to an embodiment of the present invention.

FIG. 5 provides a schematic representation of an exemplary RF device 500, such as a mobile phone, including an amplifier circuit 100 coupled between an RF source 510 and an antenna 515. In some embodiments the RF source 510 is configured to produce a Wideband Code Division Multiple Access (WCDMA) modulated RF signal. An exemplary antenna 515 comprises a phone antenna.

In the illustrated embodiment the amplifier circuit 505 is distributed across a semiconductor die 520, comprising for example a silicon substrate, and an IPD 525. In the illustrated embodiment both the semiconductor die 520 and the IPD 525 are attached to a package 530 that provides electrical paths between the semiconductor die 520 and the IPD 525. In some embodiments, the semiconductor die 520 and the IPD 525 are disposed on opposite sides of the package 530, unlike the illustrated embodiment which has the semiconductor die 520 and the IPD 525 on the same side of the package 530. For clarity, some components of the amplifier circuit 100 have been omitted, such as the amplifiers 150, 155 of the linearization circuit 115.

In the embodiment illustrated by FIG. 5 the semiconductor die 520 comprises a power amplifier core 120, a replica 140 of the power amplifier core 120, a coupler 135, an envelope detector 145, and amplifiers 150, 155 (not shown). The IPD 525 can also comprise a silicon substrate, for example, and includes input and output matching blocks 125 and 130. The components on the semiconductor die 520 and the IPD 525 are arranged in electrical communication as shown in FIG. 1.

In the foregoing specification, the invention is described with reference to specific embodiments thereof, but those skilled in the art will recognize that the invention is not limited thereto. Various features and aspects of the above-described invention may be used individually or jointly. Further, the invention can be utilized in any number of environments and applications beyond those described herein without departing from the broader spirit and scope of the specification. The specification and drawings are, accordingly, to be regarded as illustrative rather than restrictive. It will be recognized that the terms "comprising," "including," and "having," as used herein, are specifically intended to be read as open-ended terms of art.

What is claimed is:

1. A method for amplifying an RF signal, the method comprising:
    producing an envelope signal from the RF signal;
    producing, on a die, an inverted non-linear signal from the envelope signal; and
    producing a linearly amplified RF signal by applying a biased RF signal to a MOS transistor of a power amplifier core on the die, where the biased RF signal comprises the RF signal plus the inverted non-linear signal.

2. The method of claim 1 wherein producing the inverted non-linear signal includes controlling, with the envelope signal, a gate of a transistor of a replica of the power amplifier core.

3. The method of claim 1 wherein the biased RF signal additionally comprises a DC bias voltage.

4. The method of claim 1 wherein producing the envelope signal from the RF signal is also performed on the die.

5. The method of claim 1 wherein a clock signal is not employed.

6. The method of claim 1 wherein analog to digital conversion is not performed.

* * * * *